United States Patent
Kim et al.

(10) Patent No.: US 10,200,027 B1
(45) Date of Patent: Feb. 5, 2019

(54) RADIO FREQUENCY SWITCH APPARATUS WITH INTEGRATED SHUNT AND BIAS

(71) Applicant: SAMSUNG ELECTRO-MECHANICS CO., LTD., Suwon-si (KR)

(72) Inventors: Jeong Hoon Kim, Suwon-si (KR); Hyun Paek, Suwon-si (KR); Byeong Hak Jo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/877,774

(22) Filed: Jan. 23, 2018

(30) Foreign Application Priority Data

Aug. 4, 2017 (KR) .................. 10-2017-0099144

(51) Int. Cl.
*H03K 17/687* (2006.01)
*H03K 17/16* (2006.01)
*H04B 1/40* (2015.01)

(52) U.S. Cl.
CPC .......... *H03K 17/161* (2013.01); *H04B 1/40* (2013.01)

(58) Field of Classification Search
CPC ........... H03K 17/04126; H03K 17/063; H03K 17/693; H03K 17/0822; H03K 17/04123; H03K 17/6872; H03H 11/245; H04B 1/40
See application file for complete search history.

(56) References Cited

U.S. PATENT DOCUMENTS

| 7,123,898 | B2 | 10/2006 | Burgener et al. | |
| 7,427,887 | B2* | 9/2008 | O'Donnell | H03K 17/063 327/434 |
| 8,729,952 | B2 | 5/2014 | Yang et al. | |
| 2006/0261912 | A1* | 11/2006 | Miyagi | H03K 17/6871 333/103 |
| 2014/0049311 | A1 | 2/2014 | Yang et al. | |

FOREIGN PATENT DOCUMENTS

KR 10-2014-0023227 A 2/2014

* cited by examiner

*Primary Examiner* — Long Nguyen
(74) *Attorney, Agent, or Firm* — NSIP Law (57) ABSTRACT

A radio frequency (RF) switch apparatus includes a first series switch circuit including a first series switch disposed between a first terminal and a second terminal and operating in response to a first gate signal, and a first capacitor circuit and a second capacitor circuit connected across the first series switch; a first shunt-bias circuit disposed between a first connection node between the first terminal and the first series switch, and a ground, and providing a power voltage or a ground potential to the first connection node in response to a second gate signal; and a first shunt-impedance circuit connected between the first connection node and the first shunt-bias circuit and adjusting path impedance in response to a third gate signal. Each of the first capacitor circuit and the second capacitor circuit passes an alternating current (AC) signal or blocks a direct current (DC) voltage.

13 Claims, 9 Drawing Sheets

RADIO FREQUENCY SWITCH APPARATUS WITH INTEGRATED SHUNT AND BIAS

CROSS-REFERENCE TO RELATED APPLICATION(S)

This application claims the benefit under 35 USC 119(a) of Korean Patent Application No. 10-2017-0099144 filed on Aug. 4, 2017 in the Korean Intellectual Property Office, the entire disclosure of which is incorporated herein by reference for all purposes.

BACKGROUND

1. Field

The present following description relates to a radio frequency switch with an integrated shunt and bias.

2. Description of Related Art

In general, communications apparatuses, such as a cellular front-end module (FEM) may be classified as a power amplifier module (PAM), a multimode multiband power amplifier (MMPA), a power amplifier module including duplexer (PAMiD), or the like, depending on a combination of components needed to support communications and bands. As an example, PAMiD may include a plurality of power amplifiers, a controller for controlling the plurality of power amplifiers, a radio frequency (RF) switch for selecting transmission (Tx) and reception (Rx) and determining a path of each frequency signal, and a duplexer.

Recently, a PAMiD module may be provided with a component such as a low noise amplifier (LNA) so as to be manufactured as an L-PAMiD type module. Performance benchmarks of such a PAMiD module are evaluated by various criteria including maximum output, efficiency, linearity, sensitivity, and the like.

Such performance measurement is largely dependent on the performance of the component itself as well as a state such as a layout and impedance matching between the respective components in the module. The maximum output, efficiency, and linearity in the PA module may be influenced by loss, linearity performance, and the like, of the respective components such as the RF switch and the duplexer, as well as performance of PAIC itself.

The RF switch serves to perform filtering using the duplexer and a connection or separation of the signal path using the switch so that the signals of the PA are matched to the respective frequency bands. Here, examples of the RF switch include a band selection switch (SW) that controls a flow of signals between the power amplifier (PA) and the duplexer, and an antenna switch (SW) that controls a flow of signals between the duplexer and an antenna.

As an example, the band selection switch is implemented in a form of single pole multi throw (SPMT) having one input and a plurality of outputs. Such an RF switch should be able to handle high power of 30 dBm or more, have low insertion loss (IL), and have a high level of harmonics suppression performance. In order to implement a low-cost RF switch while satisfying the above-mentioned requirements, the RF switch is implemented by stacking a plurality of stages of unit transistors on a silicon on insulator (SOI) substrate.

For separation or connection of the signal path in the RF switch, VDD and −VDD voltages, which are control voltages capable of turning a transistor on or off, may be used.

Here, in order to prevent a phenomenon in which the transistor to be turned off is only slightly turned on, due to large voltage swing when the switch is turned off, a negative voltage such as −VDD may be supplied to a gate and a body of the unit transistor.

The method of supplying the negative voltage is effective for preventing malfunctioning of the RF switch, improving 1 dB compression point (P1 dB), and improving linearity such as harmonics suppression. But it has a disadvantage because (1) it requires a charge pump or the like from a positive source to generate the negative voltage, (2) the size of an integrated circuit (IC) is inevitably increased because a separate negative voltage buffer circuit is required to drive the switch, and (3) undesired spur occurs in the RF switch due to an operation of the charge pump or the like. A circuit configuration for alleviating the above-mentioned disadvantages is required.

As such, in order to solve to the disadvantages of the conventional RF switch using a negative voltage, a circuit structure that supplies a source voltage (or a drain voltage) higher than a gate voltage is proposed, so that an effect of using the negative voltage may be achieved without using the negative voltage.

Since such an RF switch supplies the source voltage, the RF switch includes a direct current (DC) blocking capacitor for blocking an input and output of a DC voltage between switch transistors.

However, such a conventional RF switch may have signal loss caused by the DC blocking capacitor and may be vulnerable to electrostatic discharge (ESD).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a radio frequency (RF) switch apparatus includes a first series switch circuit including a first series switch disposed between a first terminal and a second terminal and operating in response to a first gate signal, and a first capacitor circuit and a second capacitor circuit connected across the first series switch; a first shunt-bias circuit disposed between a first connection node between the first terminal and the first series switch, and a ground, and providing a power voltage or a ground potential to the first connection node in response to a second gate signal; and a first shunt-impedance circuit connected between the first connection node and the first shunt-bias circuit and adjusting path impedance in response to a third gate signal. Each of the first capacitor circuit and the second capacitor circuit passes an alternating current (AC) signal upon the first series switch being turned on and blocks a direct current (DC) voltage upon the first series switch being turned off in response to the first gate signal.

The first series switch may include at least one metal oxide semiconductor (MOS) transistor connected between the first capacitor circuit and the second capacitor circuit, and may be configured to be turned on or off in response to the first gate signal.

The first capacitor circuit may include a first capacitor and a first parallel MOS transistor connected between the first terminal and the first series switch and connected to each other in parallel, and the first parallel MOS transistor may be configured to be turned on or off in response to the first gate signal.

The second capacitor circuit may include a second capacitor and a second parallel MOS transistor connected between the second terminal and the first series switch and connected to each other in parallel, and the second parallel MOS transistor may be configured to be turned on or off in response to the first gate signal.

The first shunt-bias circuit may include a first N-channel MOS (NMOS) transistor configured to be connected between the first shunt-impedance circuit and a ground terminal and turned on or off in response to the second gate signal; a first P-channel MOS (PMOS) transistor configured to be connected between the first shunt-impedance circuit and a power voltage terminal and turned on or off in response to the second gate signal; and a first shunt-capacitor configured to be connected between the power voltage terminal and the ground terminal. One of the power voltage and the ground potential may be configured to be supplied to the first connection node through the first shunt-impedance circuit in response to the second gate signal.

The first shunt-impedance circuit may include a first resistor and a first resistor switch connected between the first connection node and the first shunt-bias circuit and connected to each other in parallel, and the first resistor switch may be configured to be turned on or off in response to the third gate signal.

In another general aspect, a radio frequency (RF) switch apparatus includes a first series switch circuit including a first series switch disposed between a first terminal and a common terminal and operating in response to a first gate signal, and a first capacitor circuit and a second capacitor circuit connected across the first series switch; a first shunt-bias circuit disposed between a first connection node between the first terminal and the first series switch, and a ground, and providing a power voltage or a ground potential to the first connection node in response to a second gate signal; a first shunt-impedance circuit connected between the first connection node and the first shunt-bias circuit and adjusting path impedance in response to a third gate signal; a second series switch circuit including a second series switch disposed between a second terminal and the common terminal and operating in response to a fourth gate signal, and a third capacitor circuit and a fourth capacitor circuit connected across the second series switch; a second shunt-bias circuit disposed between a second connection node between the second terminal and the second series switch, and the ground, and providing the power voltage or the ground potential to the second connection node in response to a fifth gate signal; and a second shunt-impedance circuit connected between the second connection node and the second shunt-bias circuit and adjusting the path impedance in response to a sixth gate signal. Each of the first capacitor circuit and the second capacitor circuit passes an alternating current (AC) signal upon the first series switch being turned on and blocks a direct current (DC) voltage upon the first series switch being turned off in response to the first gate signal. Each of the third capacitor circuit and the fourth capacitor circuit passes the AC signal upon the second series switch being turned on and blocks the DC voltage upon the second series switch being turned off in response to the fourth gate signal.

The first series switch may include at least one metal oxide semiconductor (MOS) transistor connected between the first capacitor circuit and the second capacitor circuit, and may be turned on or off in response to the first gate signal. The second series switch may include at least one MOS transistor connected between the third capacitor circuit and the fourth capacitor circuit, and may be turned on or off in response to the fourth gate signal.

The first capacitor circuit may include a first capacitor and a first parallel MOS transistor connected between the first terminal and the first series switch and connected to each other in parallel, and the first parallel MOS transistor may be configured to be turned on or off in response to the first gate signal. The second capacitor circuit may include a second capacitor and a second parallel MOS transistor connected between the second terminal and the first series switch, and may be connected to each other in parallel. The second parallel MOS transistor may be configured to be turned on or off in response to the first gate signal.

The third capacitor circuit may include a third capacitor and a third parallel MOS transistor connected between the second terminal and the second series switch and connected to each other in parallel. The third parallel MOS transistor may be configured to be turned on or off in response to the fourth gate signal. The fourth capacitor circuit may be configured to comprise a fourth capacitor and a fourth parallel MOS transistor connected between the common terminal and the second series switch and connected to each other in parallel. The fourth parallel MOS transistor may be configured to be turned on or off in response to the fourth gate signal.

The first shunt-bias circuit may include a first N-channel MOS (NMOS) transistor configured to be connected between the first shunt-impedance circuit and a ground terminal and be turned on or off in response to the second gate signal; a first P-channel MOS (PMOS) transistor configured to be connected between the first shunt-impedance circuit and a power voltage terminal and be turned on or off in response to the second gate signal; and a first shunt-capacitor configured to be connected between the power voltage terminal and the ground terminal. One of the power voltage and the ground potential may be configured to be supplied to the first connection node through the first shunt-impedance circuit in response to the second gate signal.

The second shunt-bias circuit may be a second NMOS transistor configured to be connected between the second shunt-impedance circuit and a ground terminal and be turned on or off in response to the fifth gate signal. A second PMOS transistor may be configured to be connected between the second shunt-impedance circuit and a power voltage terminal and be turned on or off in response to the fifth gate signal. A second shunt-capacitor may be configured to be connected between the power voltage terminal and the ground terminal. One of the power voltage and the ground potential may be configured to be supplied to the second connection node through the second shunt-impedance circuit in response to the fifth gate signal.

The first shunt-impedance circuit may include a first resistor and a first resistor switch connected between the first connection node and the first shunt-bias circuit and connected to each other in parallel. The first resistor switch may be configured to be turned on or off in response to the third gate signal. The second shunt-impedance circuit may be configured to comprise a second resistor and a second resistor switch connected between the second connection node and the second shunt-bias circuit and connected to each other in parallel. The second resistor switch may be configured to be turned on or off in response to the sixth gate signal.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
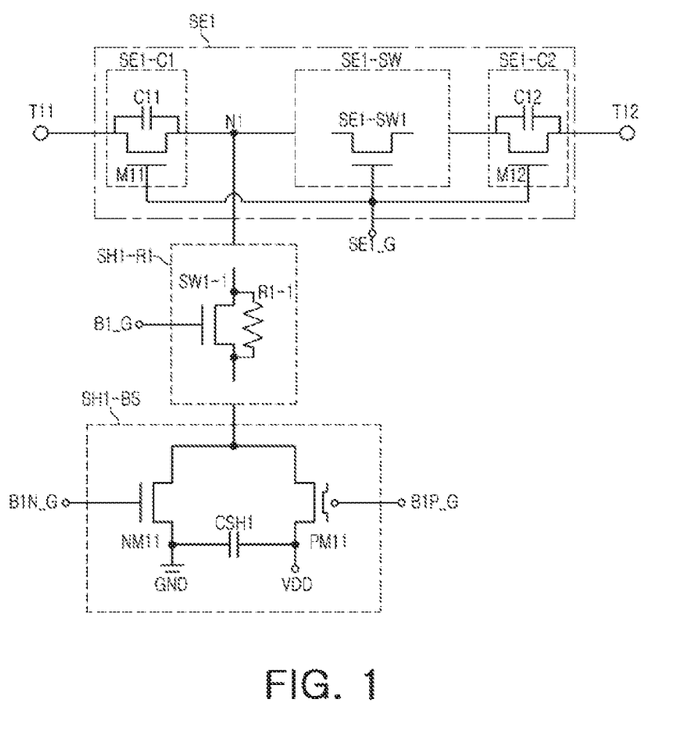
FIG. 1 is a schematic view of an example of a radio frequency (RF) switch apparatus.

FIG. 1 is a schematic view of an example of a radio frequency (RF) switch apparatus.

Referring to FIG. 1, a radio frequency (RF) switch apparatus includes a first series switch circuit SE1, a first shunt-bias circuit SH1-BS, and a first shunt-impedance circuit SH1-R1.

The first series switch circuit SE1 includes a first series switch SE1-SW, a first capacitor circuit SE1-C1, and a second capacitor circuit SE1-C2. The first series switch SE1-SW is disposed between a first terminal T11 and a second terminal T12 and operates in response to a first gate signal SE1_G. The first capacitor circuit SE1-C1 and the second capacitor circuit SE1-C2 are connected across the first series switch SE1-SW.

The first shunt-bias circuit SH1-BS is disposed between a first connection node N1 (between the first terminal T11 and the first series switch SE1-SW) and a ground, and provides a power voltage VDD or a ground GND potential to the first connection node N1 through the first shunt-impedance circuit SH1-R1 in response to second gate signals B1N_G and B1P_G.

As an example, the first shunt-bias circuit SH1-BS includes different types of N-channel metal oxide semiconductor (NMOS) transistor NM11 and P-channel metal oxide semiconductor (PMOS) transistor PM11 which are connected to each other in parallel, and includes a first shunt-capacitor CSH1 connected between a ground GND terminal connected to the NMOS transistor NM11 and a power voltage VDD terminal connected to the PMOS transistor PM11.

The first shunt-impedance circuit SH1-R1 is connected between the first connection node N1 and the first shunt-bias circuit SH1-BS, and adjusts path impedance in response to a third gate signal B1_G.

Each of the first capacitor circuit SE1-C1 and the second capacitor circuit SE1-C2 passes an alternating current (AC) signal when the first series switch SE1-SW is in an on-state and blocks a direct current (DC) voltage when the first series switch SE1-SW is in an off-state, in response to the first gate signal SE1_G.

Figure 2:
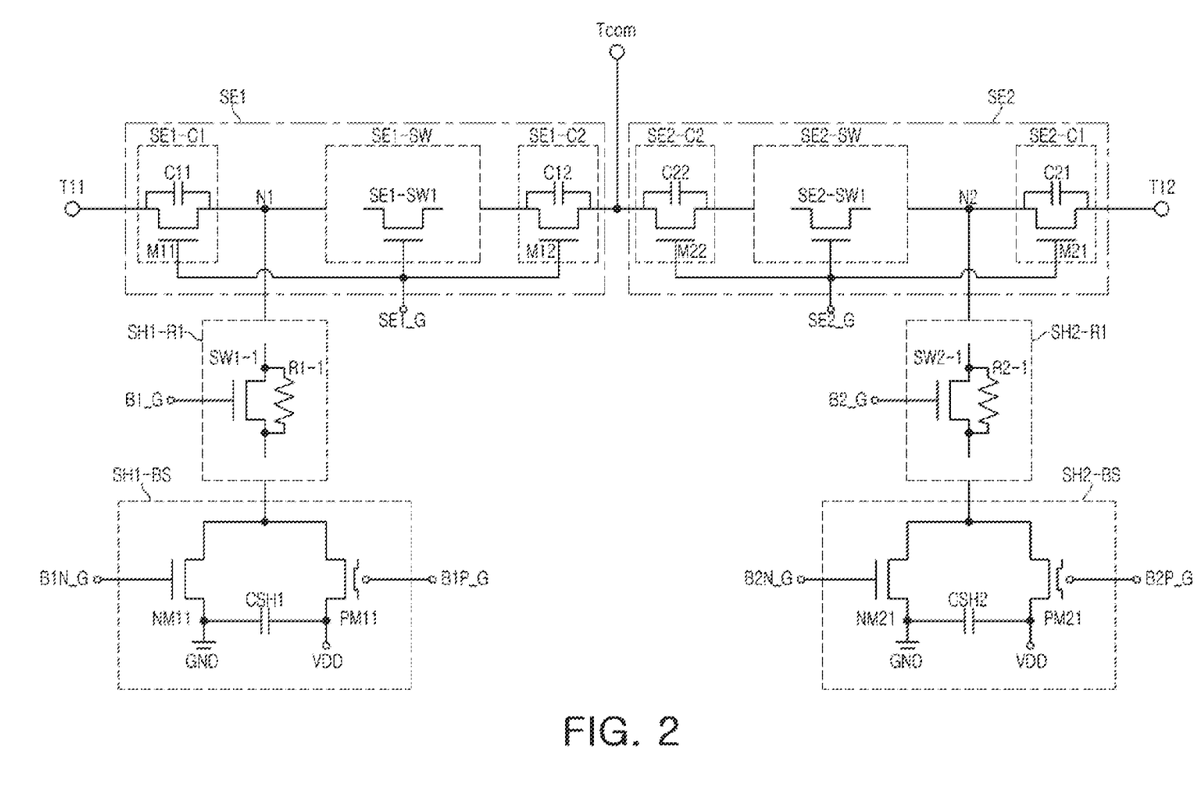
FIG. 2 is a schematic view of another example of a radio frequency (RF) switch apparatus.

FIG. 2 is schematic view of another example of a radio frequency (RF) switch apparatus.

Referring to FIG. 2, the radio frequency (RF) switch apparatus includes the first series switch circuit SE1, the first shunt-bias circuit SH1-BS, the first shunt-impedance circuit SH1-R1, a second series switch circuit SE2, a second shunt-bias circuit SH2-BS, and a second shunt-impedance circuit SH2-R1.

The first series switch circuit SE1 includes a first series switch SE1-SW, a first capacitor circuit SE1-C1, and a second capacitor circuit SE1-C2.

The first series switch SE1-SW is disposed between a first terminal T11 and a common terminal Tcom, and operates in response to a first gate signal SE1_G.

The first capacitor circuit SE1-C1 and the second capacitor circuit SE1-C2 are connected across the first series switch SE1-SW.

The first shunt-bias circuit SH1-BS is disposed between a first connection node N1 (between the first terminal T11 and the first series switch SE1-SW) and a ground, and provides a power voltage VDD or a ground GND potential to the first connection node N1 in response to second gate signals B1N_G and B1P_G.

The first shunt-impedance circuit SH1-R1 is connected between the first connection node N1 and the first shunt-bias circuit SH1-BS, and adjusts path impedance in response to a third gate signal B1_G.

The second series switch circuit SE2 includes a second series switch SE2-SW, a third capacitor circuit SE2-C1, and a fourth capacitor circuit SE2-C2. The second series switch SE2-SW is disposed between a second terminal T12 and the common terminal Tcom, and operates in response to a fourth gate signal SE2_G. The third capacitor circuit SE2-C1 and the fourth capacitor circuit SE2-C2 are connected across the second series switch SE2-SW.

The second shunt-bias circuit SH2-BS is disposed between a second connection node N2 (between the second terminal T12 and the second series switch SE2-SW) and the ground, and provides a power voltage VDD or a ground GND potential to the second connection node N2 in response to fifth gate signals B2N_G and B2P_G.

The second shunt-impedance circuit SH2-R1 is connected between the second connection node N2 and the second shunt-bias circuit SH2-BS, and adjusts path impedance in response to a sixth gate signal B2_G.

Each of the first capacitor circuit SE1-C1 and the second capacitor circuit SE1-C2 passes an alternating current (AC) signal when the first series switch SE1-SW is in an on-state and blocks a direct current (DC) voltage when the first series switch SE1-SW is in an off-state in response to the first gate signal SE1_G.

Further, each of the third capacitor circuit SE2-C1 and the fourth capacitor circuit SE2-C2 passes the AC signal when the second series switch SE2-SW is in the on-state and blocks the DC voltage when the second series switch SE2-SW is in the off-state in response to the fourth gate signal SE2_G.

Referring to FIGS. 1 and 2, as an example, the first series switch SE1-SW includes at least one MOS transistor SE1-SW1 connected between the first capacitor circuit SE1-C1 and the second capacitor circuit SE1-C2, and is turned on or off in response to the first gate signal SE1_G.

The first capacitor circuit SE1-C1 includes a first capacitor C11 and a first parallel MOS transistor M11 which are connected between the first terminal T11 and the first series switch SE1-SW, and connected to each other in parallel. The first parallel MOS transistor M11 may be turned on or off in response to the first gate signal SE1_G.

The second capacitor circuit SE1-C2 includes a second capacitor C12 and a second parallel MOS transistor M12 which are connected between the second terminal T12 and the first series switch SE1-SW, and connected to each other in parallel. The second parallel MOS transistor M12 may be turned on or off in response to the first gate signal SE1_G.

The first shunt-bias circuit SH1-BS includes a first NMOS transistor NM11 connected between the first shunt-impedance circuit SH1-R1 and the ground GND terminal, and turned on or off in response to the second gate signals B1N_G and B1P_G; a first PMOS transistor PM11 connected between the first shunt-impedance circuit SH1-R1 and the power voltage VDD terminal, and turned on or off in response to the second gate signals B1N_G and B1P_G; and a first shunt-capacitor CSH1 connected between the power voltage VDD terminal and the ground GND terminal.

The first shunt-bias circuit SH1-BS supplies one of the power voltage VDD and the ground GND potential to the first connection node N1 through the first-shunt impedance circuit SH1-R1 in response to the second gate signals B1N_G and B1P_G.

The first shunt-impedance circuit SH1-R1 includes at least one first resistor R1-1 and at least one first resistor switch SW1-1 which are connected between the first connection node N1 and the first shunt-bias circuit SH1-BS, and connected to each other in parallel.

The first resistor switch SW1-1 is turned on or off in response to the third gate signal B1_G.

Referring to FIG. 2, as an example, the second series switch SE2-SW includes at least one MOS transistor connected between the third capacitor circuit SE2-C1 and the fourth capacitor circuit SE2-C2, and is turned on or off in response to the fourth gate signal SE2_G.

The third capacitor circuit SE2-C1 includes a third capacitor C21 and a third parallel MOS transistor M21, connected between the second terminal T12 and the second series switch SE2-SW, and connected to each other in parallel. The third parallel MOS transistor M21 is turned on or off in response to the fourth gate signal SE2_G.

The fourth capacitor circuit SE2-C2 includes a fourth capacitor C22 and a fourth parallel MOS transistor M22, connected between the common terminal Tcom and the second series switch SE2-SW, and connected to each other in parallel.

The fourth parallel MOS transistor M22 is turned on or off in response to the fourth gate signal SE2_G.

The second shunt-bias circuit SH2-BS includes a second NMOS transistor NM21 connected between the second shunt-impedance circuit SH2-R1 and the ground GND terminal, and turned on or off in response to the fifth gate signals B2N_G and B2P_G; a second PMOS transistor PM21 connected between the second shunt-impedance circuit SH2-R1 and the power voltage VDD terminal, and turned on or off in response to the fifth gate signals B2N_G and B2P_G; and a second shunt-capacitor CSH2 connected between the power voltage VDD terminal and the ground GND terminal.

The second shunt-bias circuit SH2-BS supplies one of the power voltage VDD and the ground GND potential to the second connection node N2 through the second shunt-impedance circuit SH2-R1 in response to the fifth gate signals B2N_G and B2P_G.

The second shunt-impedance circuit SH2-R1 includes at least one second resistor R2-1 and at least one second resistor switch SW2-1 which are connected between the second connection node N2 and the second shunt-bias circuit SH2-BS, and connected to each other in parallel. The second resistor switch SW2-1 is turned on or off in response to a sixth gate signal B2_G.

In the respective drawings of the present disclosure, unnecessary overlapped descriptions are possibly omitted for components having the same reference numeral and the same function, and differences in the respective drawings will be described.

Figure 3:
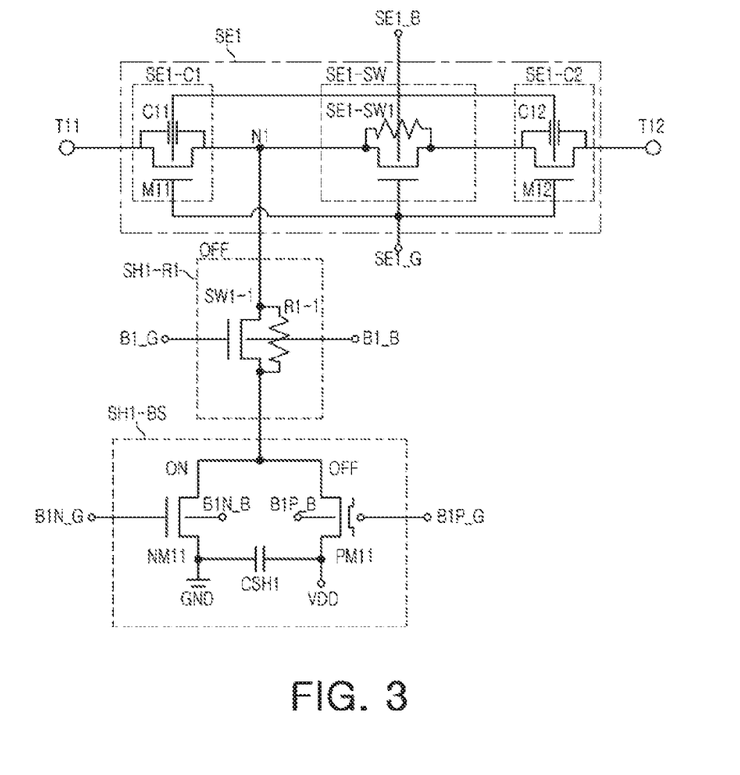
FIG. 3 is a schematic view of the RF switch apparatus of FIG. 1.
Figure 4:
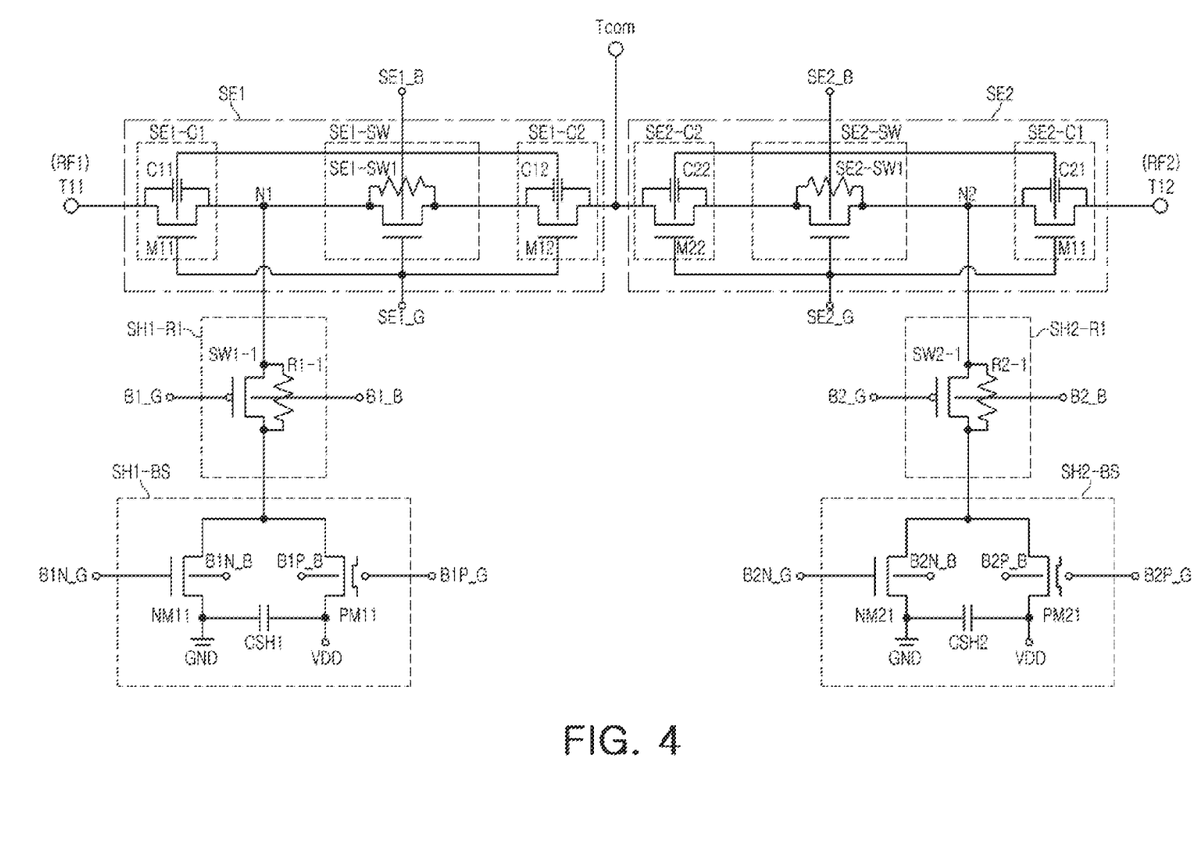
FIG. 4 is a schematic view of the RF switch apparatus of FIG. 2.

FIG. 3 is a schematic view of the RF switch apparatus of FIG. 1 and FIG. 4 is a schematic view of the RF switch apparatus of FIG. 2.

Referring to FIGS. 3 and 4, the first series switch SE1-SW includes one MOS transistor SE1-SW1 connected between the first capacitor circuit SE1-C1 and the second capacitor circuit SE1-C2, and turned on or off in response to the first gate signal SE1-G and a first body signal B21_B.

The first shunt-impedance circuit SH1-R1 includes one first resistor R1-1 and one first resistor switch SW1-1 which are connected between the first connection node N1 and the first shunt-bias circuit SH1-BS, and connected to each other in parallel. The first resistor switch SW1-1 is turned on or off in response to the third gate signal B1_G and a third body signal B1_B.

Here, the first resistor R1-1 is an impedance element having high impedance for an AC signal, and as an example, a resistor element may be employed, but the first resistor R1-1 is not limited thereto.

As an example, the first shunt-bias circuit SH1-BS includes the first NMOS transistor NM11, the first PMOS transistor PM11, and the first shunt-capacitor CSH1. The first NMOS transistor NM11 and the first PMOS transistor PM11 are turned on or off in response to the second gate signals B1N_G and B1P_G and second body signals B1N_B and B1P_B.

Referring to FIG. 4, the second series switch SE2-SW includes one MOS transistor SE2-SW1 connected between the third capacitor circuit SE2-C1 and the fourth capacitor circuit SE2-C2, and is turned on or off in response to the fourth gate signal SE2-G and a fourth body signal B2_B.

The second shunt-impedance circuit SH2-R1 includes one second resistor R2-1 and one second resistor switch SW2-1 which are connected between the second connection node N2 and the second shunt-bias circuit SH2-BS, and connected to each other in parallel. The second resistor switch SW2-1 is turned on or off in response to the sixth gate signal B2_G and a sixth body signal B2_B.

As an example, the second shunt-bias circuit SH2-BS includes the second NMOS transistor NM21, the second PMOS transistor PM21, and the second shunt-capacitor CSH2. The second NMOS transistor NM21 and the second PMOS transistor PM21 are turned on or off in response to the fifth gate signals B2N_G and B2P_G and fifth body signals B2N_B and B2P_B.

Figure 5:
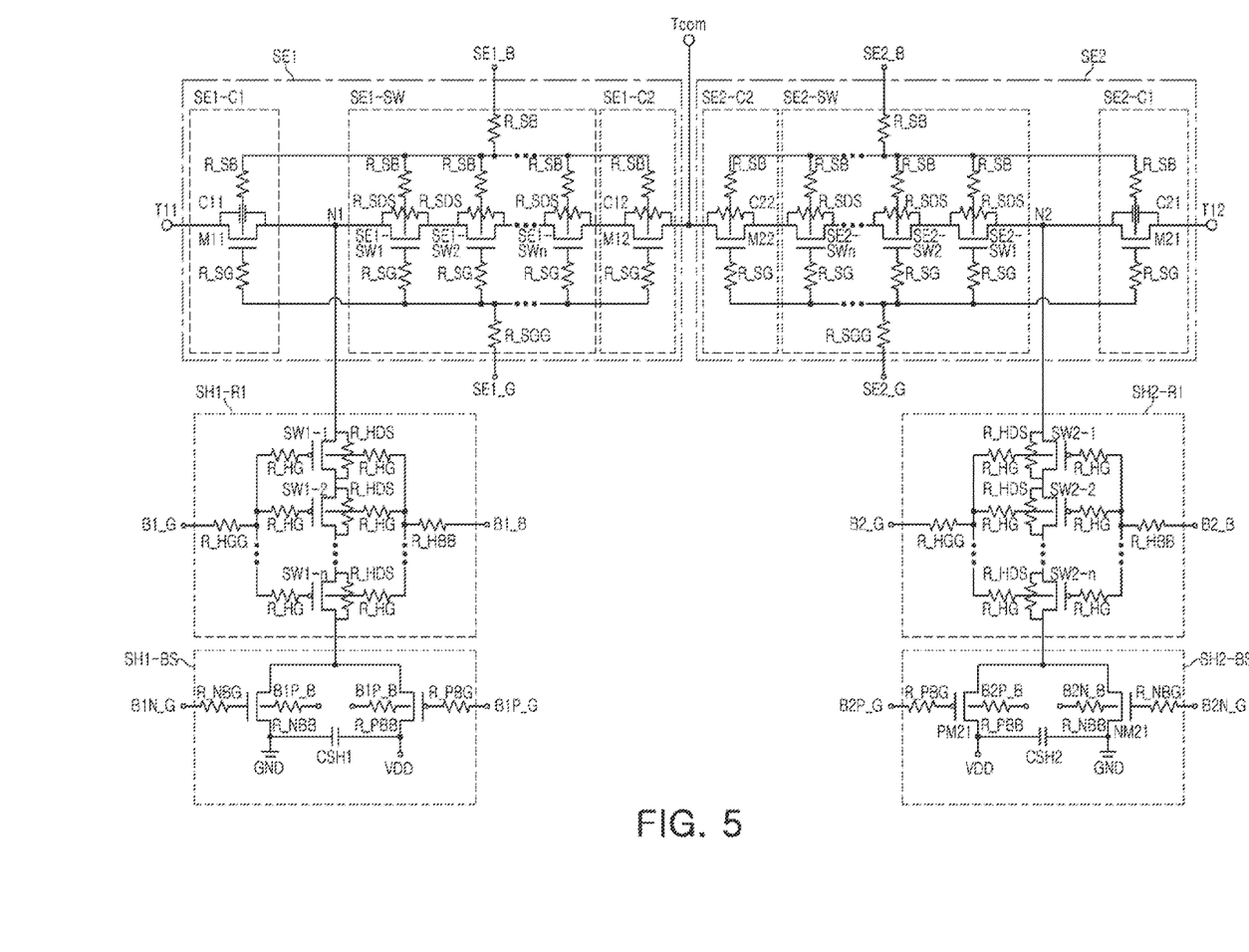
FIG. 5 is a schematic view of another example of the RF switch apparatus of FIG. 2.

FIG. 5 is a schematic view of another example of the RF switch apparatus of FIG. 2.

Referring to FIG. 5, the first series switch SE1-SW includes first, second to n-th MOS transistors SE1-SW1, SE1-SW2 to SE1-SWn connected in series between the first capacitor circuit SE1-C1 and the second capacitor circuit SE1-C2. The first, second to n-th MOS transistors SE1-SW1, SE1-SW2 to SE1-SWn are NMOS transistors, which are turned on or off in response to the first gate signal SE1_G and the first body signal SE1_B.

Further, the second series switch SE2-SW includes first, second to n-th MOS transistors SE2-SW1, SE2-SW2 to SE2-SWn connected in series between the third capacitor circuit SE2-C1 and the fourth capacitor circuit SE2-C2. The first, second to n-th MOS transistors SE2-SW1, SE2-SW2 to SE2-SWn are NMOS transistors, which are turned on or off in response to the fourth gate signal SE2_G.

Here, R_SG denotes a gate resistance connected between a gate of the corresponding MOS transistor and a terminal of the first gate signal SE1_G, R_SGG denotes a common gate resistance commonly connected between the gate of the corresponding MOS transistor and the terminal of the first gate signal SE1_G, R_SDS denotes a drain-source resistance of the corresponding MOS transistor, R_SB denotes a body resistance connected between a body of the corresponding MOS transistor and the terminal of the first gate signal SE1_G, and R_SBB denotes a common body resistance commonly connected between the body of the corresponding MOS transistor and the terminal of the first gate signal SE1_G. In addition, SE1_B and SE2_B denote body signals.

The first shunt-impedance circuit SH1-R1 includes first, second to n-th switched resistor circuits connected in series between the first connection node N1 and the first shunt-bias circuit SH1-BS, the first switched resistor circuit includes a first resistor R1-1 and a first resistor switch SW1-1 which are connected to each other in parallel, the second switched resistor circuit includes a second resistor R1-2 and a second resistor switch SW1-2 which are connected to each other in parallel, and the n-th switched resistor circuit includes a n-th resistor R1-*n* and a n-th resistor switch SW1-*n* which are connected to each other in parallel.

The first, second to n-th resistor switches SW1-1, SW1-2 to SW1-*n* of the first shunt-impedance circuit SH1-R1 are PMOS transistors, which are turned on or off in response to the third gate signal B1_G and the third body signal B1_B.

The second shunt-impedance circuit SH2-R1 includes first, second to n-th switched resistor circuits connected in series between the second connection node N2 and the second shunt-bias circuit SH2-BS. The first switched resistor circuit includes a first resistor R2-1 and a first resistor switch SW2-1 which are connected to each other in parallel. The second switched resistor circuit includes a second resistor R2-2 and a second resistor switch SW2-2 which are connected to each other in parallel. The n-th switched resistor circuit includes a n-th resistor R2-*n* and a n-th resistor switch SW2-*n* which are connected to each other in parallel.

The first, second to n-th resistor switches SW1-1, SW1-2 to SW1-n of the second shunt-impedance circuit SH2-R1 are PMOS transistors, which are turned on or off in response to the sixth gate signal B2_G and the sixth body signal B2_B.

Here, R_HG denotes a gate resistance connected between a gate of the corresponding resistor switch and a terminal of the third gate signal B1_G, R_HGG denotes a common gate resistance which is commonly connected between the gate of the corresponding resistor switch and the terminal of the third gate signal B1_G, R_HB denotes a body resistance connected between a body of the corresponding resistor switch and the terminal of the third gate signal B1_G, and R_HBB denotes a common body resistance connected between the body of the corresponding resistor switch and the terminal of the third gate signal B1_G. In addition, B1_B and B2_B denote body signals.

As an example, one of the first NMOS transistor NM11 and the first PMOS transistor PM11 of the first shunt-bias circuit SH1-BS is turned on in response to the second gate signals B1N_G and B1P_G and the second body signals B1N_B and B1P_B.

Further, one of the second NMOS transistor NM21 and the second PMOS transistor PM21 of the second shunt-bias circuit SH2-BS is turned on in response to the fifth gate signals B2N_G and B2P_G and the fifth body signals B2N_B and B2P_B.

Figure 6:
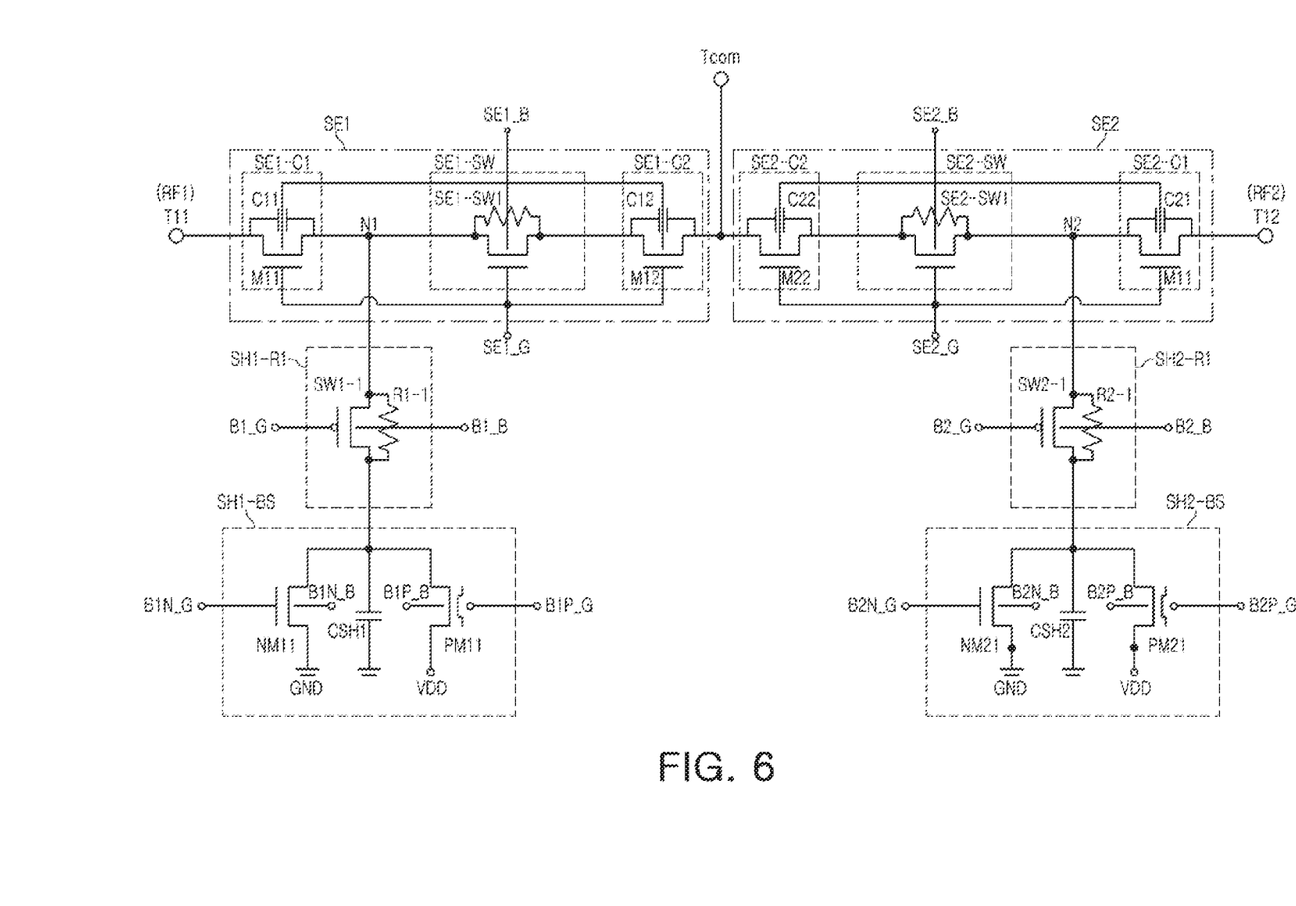
FIG. 6 is a schematic view of another example of the RF switch apparatus of FIG. 2.

FIG. 6 is a schematic view of another example of the RF switch apparatus of FIG. 2.

Referring to FIG. 6, the first shunt-bias circuit SH1-BS includes a first NMOS transistor NM11 connected between the first shunt-impedance circuit SH1-R1 and the ground GND terminal, and turned on or off in response to the second gate signals B1N_G and B1P_G. A first PMOS transistor PM11 is connected between the first shunt-impedance circuit SH1-R1 and the power voltage VDD terminal, and turned on or off in response to the second gate signals B1N_G and B1P_G. A first shunt-capacitor CSH1 is connected between a connection node between the first NMOS transistor NM11 and the first PMOS transistor PM11, and the ground.

The first shunt-bias circuit SH1-BS supplies one of the power voltage VDD and the ground GND potential to the first connection node N1 through the first-shunt impedance circuit SH1-R1 in response to the second gate signals B1N_G and B1P_G.

Further, the second shunt-bias circuit SH2-BS includes a second NMOS transistor NM21 connected between the second shunt-impedance circuit SH2-R1 and the ground GND terminal, and turned on or off in response to the fifth gate signals B2N_G and B2P_G. A second PMOS transistor PM21 is connected between the second shunt-impedance circuit SH2-R1 and the power voltage VDD terminal, and turned on or off in response to the fifth gate signals B2N_G and B2P_G. A second shunt-capacitor CSH2 is connected between a connection node between the second NMOS transistor NM21 and the second PMOS transistor PM21, and the ground.

The second shunt-bias circuit SH2-BS supplies one of the power voltage VDD and the ground GND potential to the second connection node N2 through the second shunt-impedance circuit SH2-R1 in response to the fifth gate signals B2N_G and B2P_G.

Figure 7:
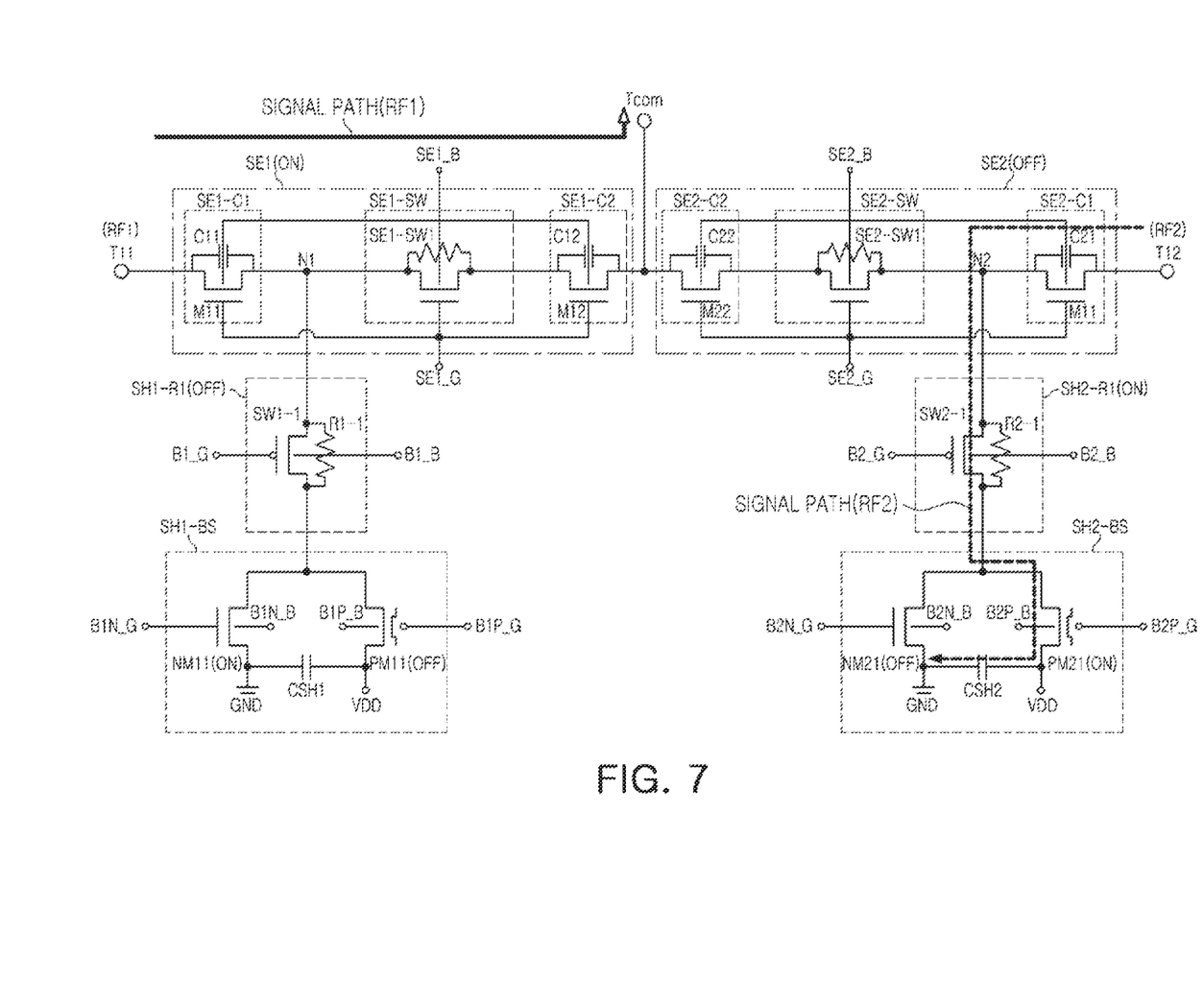
FIG. 7 is a schematic view of an operation of the RF switch apparatus of FIG. 4.

FIG. 7 is a schematic view of an operation of the RF switch apparatus of FIG. 4.

A first operation (see FIG. 8) of the RF switch apparatus will be described with reference to FIGS. 4 and 7. When the first gate signal SE1_G has a high level, the first series switch circuit SE1 is turned on. When the third gate signal B1_G has a high level, the first resistor switch SW1-1 of the first shunt-impedance circuit SH1-R1 is turned off, such that a high impedance path is formed through the first resistor R1-1 of the first shunt-impedance circuit SH1-R1. When the second gate signals B1N_G and B1P_G have high levels, the first NMOS transistor NM11 of the first shunt-bias circuit SH1-BS is turned on and the first PMOS transistor PM11 thereof is turned off.

In this case, since the ground GND potential through the first NMOS transistor NM11 which is turned on is provided to the first connection node N1 through the first resistor R1-1 of the first shunt-impedance circuit SH1-R1 and the first gate signal SE1_G has a high level, the first series switch circuit SE1 is continuously turned on and the signal which is input through the first terminal T11 is provided to the common terminal Tcom through the first series switch circuit SE1.

Further, since a high impedance path is formed through the first resistor R1-1 of the first shunt-impedance circuit SH1-R1, the signal which is input through the first terminal T11 does not escape to the ground through the first shunt-impedance circuit SH1-R1 and is provided to the common terminal Tcom without leakage.

Further, when the fourth gate signal SE2_G has a low level, the second series switch circuit SE2 is turned off and when the sixth gate signal B2_G has a low level, the second resistor switch SW2-1 of the second shunt-impedance circuit SH2-R1 is turned on, such that a low impedance path is formed through the second resistor switch SW2-1. When the fifth gate signals B2N_G and B2P_G have low levels, the second NMOS transistor NM21 of the second shunt-bias circuit SH2-BS is turned off and the second PMOS transistor PM21 thereof is turned on.

In this case, since the power voltage VDD through the second PMOS transistor PM21, which is turned on is provided to the second connection node N2 through the second resistor switch SW2-1 of the second shunt-impedance circuit SH2-R1 and the fourth gate signal SE2_G has a low level, the second series switch circuit SE2 is continuously turned off and the signal which is input through the second terminal T12 flows into the ground GND through the second resistor switch SW2-1 of the second shunt-impedance circuit SH2-R1, the second PMOS transistor PM21 of the second shunt-bias circuit SH2-BS, and the second shunt-capacitor CSH2.

The first operation (see FIG. 8) of the RF switch apparatus was described with reference to FIG. 7. On the contrary, in a second operation (see FIG. 8) of the RF switch apparatus, when the first gate signal SE1_G has a low level, the first series switch circuit SE1 is turned off and when the third gate signal B1_G has a low level, the first resistor switch SW1-1 of the first shunt-impedance circuit SH1-R1 is turned on, such that a low impedance path is formed through the first resistor switch SW1-1 of the first shunt-impedance circuit SH1-R1. When the second gate signals B1N_G and B1P_G have a low level, the first NMOS transistor NM11 of the first shunt-bias circuit SH1-BS is turned off and the first PMOS transistor PM11 thereof is turned on.

In this case, since the power voltage VDD through the first PMOS transistor PM11, which is turned on is provided to the first connection node N1 through the first resistor switch SW1-1 of the first shunt-impedance circuit SH1-R1 and the first gate signal SE1_G has a low level, the first series switch circuit SE1 are continuously turned off and the signal which is input through the first terminal T11 flows into the ground GND through the first resistor switch SW1-1 of the first shunt-impedance circuit SH1-R1, the first PMOS transistor PM11 of the first shunt-bias circuit SH1-BS, and the first shunt-capacitor CSH1.

Further, when the fourth gate signal SE2_G has a high level, the second series switch circuit SE2 is turned on. When the sixth gate signal B2_G has a high level, the second resistor R2-1 of the second shunt-impedance circuit SH2-R1 is turned off, such that a high impedance path is formed through the second resistor R2-1. When the fifth gate signals B2N_G and B2P_G have high levels, the second NMOS transistor NM21 of the second shunt-bias circuit SH2-BS is turned on and the second PMOS transistor PM21 thereof is turned off.

In this case, since the ground GND potential through the second NMOS transistor NM21 which is turned on is provided to the second connection node N2 through the second resistor R2-1 of the second shunt-impedance circuit SH2-R1 and the fourth gate signal SE2_G has a high level, the second series switch circuit SE2 is continuously turned on and the signal which is input through the common terminal Tcom is provided to the second terminal T12 through the second series switch circuit SE2.

Figure 8:
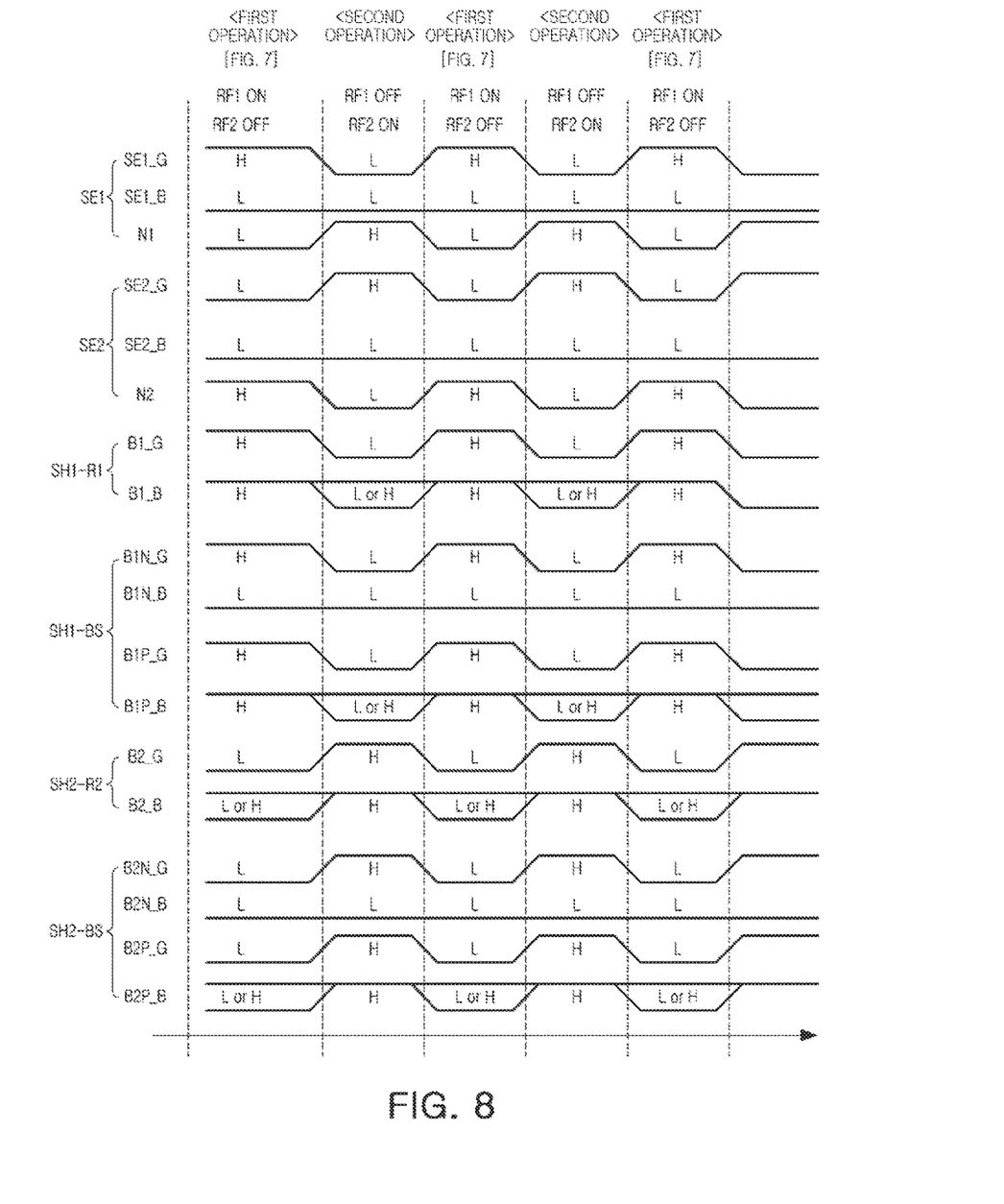
FIG. 8 is a timing chart of main signals of the RF switch apparatus of FIG. 4.

FIG. 8 is a timing chart of main signals of the RF switch apparatus of FIG. 4.

Referring to FIG. 8, timings of main signals for each of the first operation and the second operation of the RF switch apparatus are illustrated and voltage levels of the main signals for the first operation as illustrated in FIG. 7 are illustrated.

Further, unlike the operation of FIG. 7, FIG. 8 illustrates the voltage levels of the main signals for the second operation corresponding to a case in which the first series switch circuit SE1 is turned off and the second series switch circuit SE2 is turned on.

Figure 9:
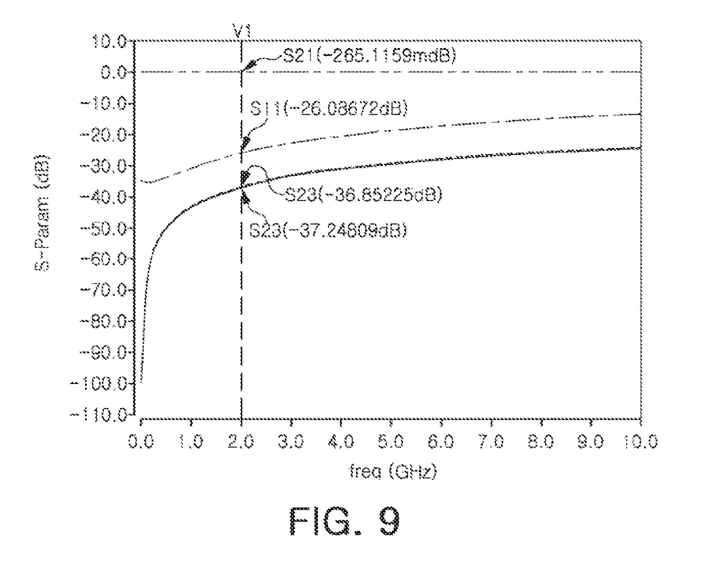
FIG. 9 is a schematic view of small signal performance of a radio frequency (RF) switch apparatus according to an exemplary embodiment in the present disclosure.

FIG. 9 is a schematic view of small signal performance of a radio frequency (RF) switch apparatus.

FIG. 9 illustrates a result obtained by verifying small signal performance with a simulation at the time of an on-off operation for a single-pole, double-throw (SPDT) RF switch. In S-parameter Skm illustrated in FIG. 9, k denotes an arrival terminal, m denotes a start terminal, 1 denotes a first terminal T11, 2 denotes a second terminal T12, and 3 denotes a common terminal.

Referring to FIG. 9, the first series switch SE1-SW may include eight NMOS stacks, the first capacitor C11 of the first capacitor circuit SE1-C1 may have 1 pF and the first parallel MOS transistor M11 thereof may be the NMOS transistor, the first shunt-impedance circuit SH1-R1 may include eight PMOS stacks which are connected in parallel to the resistor, and the first shunt-bias circuit SH1-BS may be formed of a pair of NMOS and PMOS.

Here, performances of insertion loss of 0.4 dB (S21), return loss of −10 dB (S11), and isolation of −25 dB (S13, S23) which are required by a power amplifier such as PAMiD or the like may be satisfied.

Figure 10:
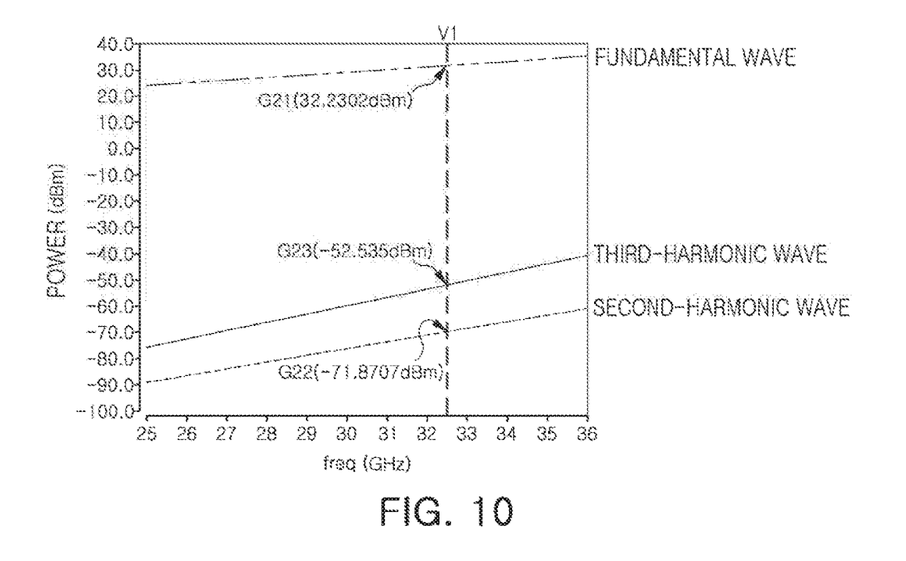
FIG. 10 is a schematic view of high signal performance of the radio frequency (RF) switch apparatus according to an exemplary embodiment in the present disclosure.

FIG. 10 is a schematic view of high signal performance of the radio frequency (RF) switch apparatus according to an exemplary embodiment in the present disclosure.

In FIG. 10, G21 is a power graph for a fundamental wave at the common terminal, G22 is a power graph for a second-harmonic wave at the common terminal, and G23 is a power graph for a third-harmonic wave at the common terminal.

Referring to G21 illustrated in FIG. 10, it is illustrated that a power condition (32 dBm) for the fundamental wave is satisfied, and referring to G22 and G23, it is illustrated that a power condition (−40 dBm) for the second and third harmonic waves is satisfied.

As set forth above, according to the exemplary embodiments in the present disclosure, in order to be able to achieve the effect of using the negative voltage without using the negative voltage, in the circuit structure of supplying the source voltage (or the drain voltage) higher than the gate voltage, the RF switch apparatus may reduce the size while including the DC blocking capacitor for blocking the DC voltage between the switch transistors, improve the signal loss, and improve vulnerability of the ESD.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency (RF) switch apparatus, comprising:
a first series switch circuit comprising a first series switch disposed between a first terminal and a second terminal and operating in response to a first gate signal, and a first capacitor circuit and a second capacitor circuit connected across the first series switch;
a first shunt-bias circuit configured to be disposed between a first connection node between the first terminal and the first series switch, and a ground, and provide a power voltage or a ground potential to the first connection node in response to a second gate signal; and
a first shunt-impedance circuit configured to be connected between the first connection node and the first shunt-bias circuit and adjust path impedance in response to a third gate signal,
wherein each of the first capacitor circuit and the second capacitor circuit is configured to pass an alternating current (AC) signal upon the first series switch being turned on and block a direct current (DC) voltage upon the first series switch being turned off in response to the first gate signal.

2. The RF switch apparatus of claim 1, wherein the first series switch comprises at least one metal oxide semiconductor (MOS) transistor connected between the first capacitor circuit and the second capacitor circuit, and configured to be turned on or off in response to the first gate signal.

3. The RF switch apparatus of claim 1, wherein the first capacitor circuit comprises a first capacitor and a first parallel MOS transistor connected between the first terminal and the first series switch and connected to each other in parallel, and
the first parallel MOS transistor is configured to be turned on or off in response to the first gate signal.

4. The RF switch apparatus of claim 1, wherein the second capacitor circuit comprises a second capacitor and a second parallel MOS transistor connected between the second terminal and the first series switch and connected to each other in parallel, and
  the second parallel MOS transistor is configured to be turned on or off in response to the first gate signal.

5. The RF switch apparatus of claim 1, wherein the first shunt-bias circuit comprises:
  a first N-channel MOS (NMOS) transistor configured to be connected between the first shunt-impedance circuit and a ground terminal and turned on or off in response to the second gate signal;
  a first P-channel MOS (PMOS) transistor configured to be connected between the first shunt-impedance circuit and a power voltage terminal and turned on or off in response to the second gate signal; and
  a first shunt-capacitor configured to be connected between the power voltage terminal and the ground terminal, and
  wherein one of the power voltage and the ground potential is configured to be supplied to the first connection node through the first shunt-impedance circuit in response to the second gate signal.

6. The RF switch apparatus of claim 1, wherein the first shunt-impedance circuit comprises a first resistor and a first resistor switch connected between the first connection node and the first shunt-bias circuit and connected to each other in parallel, and
  the first resistor switch is configured to be turned on or off in response to the third gate signal.

7. A radio frequency (RF) switch apparatus comprising:
  a first series switch circuit comprising a first series switch disposed between a first terminal and a common terminal and operating in response to a first gate signal, and a first capacitor circuit and a second capacitor circuit connected across the first series switch;
  a first shunt-bias circuit configured to be disposed between a first connection node between the first terminal and the first series switch, and a ground, and provide a power voltage or a ground potential to the first connection node in response to a second gate signal;
  a first shunt-impedance circuit configured to be connected between the first connection node and the first shunt-bias circuit, and adjust path impedance in response to a third gate signal;
  a second series switch circuit comprising a second series switch disposed between a second terminal and the common terminal and operating in response to a fourth gate signal, and a third capacitor circuit and a fourth capacitor circuit connected across the second series switch;
  a second shunt-bias circuit configured to be disposed between a second connection node between the second terminal and the second series switch, and the ground, and provide the power voltage or the ground potential to the second connection node in response to a fifth gate signal; and
  a second shunt-impedance circuit configured to be connected between the second connection node and the second shunt-bias circuit and adjust the path impedance in response to a sixth gate signal,
  wherein each of the first capacitor circuit and the second capacitor circuit is configured to pass an alternating current (AC) signal upon the first series switch being turned on and block a direct current (DC) voltage upon the first series switch being turned off in response to the first gate signal, and
  wherein each of the third capacitor circuit and the fourth capacitor circuit is configured to pass the AC signal upon the second series switch being turned on and block the DC voltage upon the second series switch being turned off in response to the fourth gate signal.

8. The RF switch apparatus of claim 7, wherein the first series switch comprises at least one metal oxide semiconductor (MOS) transistor connected between the first capacitor circuit and the second capacitor circuit, and is turned on or off in response to the first gate signal, and
  the second series switch comprises at least one MOS transistor connected between the third capacitor circuit and the fourth capacitor circuit, and is turned on or off in response to the fourth gate signal.

9. The RF switch apparatus of claim 7, wherein the first capacitor circuit comprises a first capacitor and a first parallel MOS transistor connected between the first terminal and the first series switch and connected to each other in parallel, and
  the first parallel MOS transistor is configured to be turned on or off in response to the first gate signal, and
  wherein the second capacitor circuit comprises a second capacitor and a second parallel MOS transistor connected between the second terminal and the first series switch, and is connected to each other in parallel, and
  the second parallel MOS transistor is configured to be turned on or off in response to the first gate signal.

10. The RF switch apparatus of claim 7, wherein the third capacitor circuit comprises a third capacitor and a third parallel MOS transistor connected between the second terminal and the second series switch and connected to each other in parallel,
  the third parallel MOS transistor is configured to be turned on or off in response to the fourth gate signal, and
  wherein the fourth capacitor circuit is configured to comprise a fourth capacitor and a fourth parallel MOS transistor connected between the common terminal and the second series switch and connected to each other in parallel, and
  the fourth parallel MOS transistor is configured to be turned on or off in response to the fourth gate signal.

11. The RF switch apparatus of claim 7, wherein the first shunt-bias circuit comprises:
  a first N-channel MOS (NMOS) transistor configured to be connected between the first shunt-impedance circuit and a ground terminal and be turned on or off in response to the second gate signal;
  a first P-channel MOS (PMOS) transistor configured to be connected between the first shunt-impedance circuit and a power voltage terminal and be turned on or off in response to the second gate signal; and
  a first shunt-capacitor configured to be connected between the power voltage terminal and the ground terminal, and
  wherein one of the power voltage and the ground potential is configured to be supplied to the first connection node through the first shunt-impedance circuit in response to the second gate signal.

12. The RF switch apparatus of claim 7, wherein the second shunt-bias circuit comprises:

a second NMOS transistor configured to be connected between the second shunt-impedance circuit and a ground terminal and be turned on or off in response to the fifth gate signal;

a second PMOS transistor configured to be connected between the second shunt-impedance circuit and a power voltage terminal and be turned on or off in response to the fifth gate signal; and a second shunt-capacitor configured to be connected between the power voltage terminal and the ground terminal, and wherein one of the power voltage and the ground potential is configured to be supplied to the second connection node through the second shunt-impedance circuit in response to the fifth gate signal.

13. The RF switch apparatus of claim 7, wherein the first shunt-impedance circuit comprises a first resistor and a first resistor switch connected between the first connection node and the first shunt-bias circuit and connected to each other in parallel, the first resistor switch is configured to be turned on or off in response to the third gate signal, wherein the second shunt-impedance circuit is configured to comprise a second resistor and a second resistor switch connected between the second connection node and the second shunt-bias circuit and connected to each other in parallel, and the second resistor switch is configured to be turned on or off in response to the sixth gate signal.

* * * * *